(12) United States Patent
Takashima

(10) Patent No.: US 10,877,078 B2
(45) Date of Patent: Dec. 29, 2020

(54) VOLTAGE DETERMINATION DEVICE

(71) Applicant: KEIHIN CORPORATION, Tokyo (JP)

(72) Inventor: Yuzuru Takashima, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 105 days.

(21) Appl. No.: 16/353,264

(22) Filed: Mar. 14, 2019

(65) Prior Publication Data

US 2019/0302153 A1 Oct. 3, 2019

(30) Foreign Application Priority Data

Mar. 30, 2018 (JP) ................................ 2018-066818

(51) Int. Cl.
*G01R 19/10* (2006.01)
*H05K 1/11* (2006.01)
(Continued)

(52) U.S. Cl.
CPC .............. *G01R 19/10* (2013.01); *H01L 24/47* (2013.01); *H05K 1/0256* (2013.01);
(Continued)

(58) Field of Classification Search
CPC ........ H05K 1/0256; H05K 1/18; H05K 1/114; H05K 2201/10151; H05K 1/0298;
(Continued)

(56) References Cited

U.S. PATENT DOCUMENTS 7,362,588 B2 * 4/2008 Shimizu ............. G01R 31/3835
361/785
7,403,016 B2 * 7/2008 Furukawa ............... B60L 58/21
324/426

(Continued)

FOREIGN PATENT DOCUMENTS

JP 2001174531 A 6/2001
JP 2005201867 A 7/2005
(Continued)

OTHER PUBLICATIONS

JP Notice of Reasons for Rejection corresponding to Application No. 2018-066818; dated Dec. 4, 2018.
(Continued)

*Primary Examiner* — Vinh P Nguyen
(74) *Attorney, Agent, or Firm* — Cantor Colburn LLP

(57) ABSTRACT

A voltage determination device includes: a printed wiring board on which first to third substrate terminals are arranged in substantially one line; first and second voltage determination circuits mounted on the printed wiring board and disposed on a first side of the printed wiring board divided by a line passing through the first to third substrate terminals; a first printed wiring connecting the first substrate terminal and the first voltage determination circuit; a second printed wiring connecting the second substrate terminal and the first voltage determination circuit; a third printed wiring connecting the third substrate terminal and the second voltage determination circuit; and a fourth printed wiring connecting the second substrate terminal and the second voltage determination circuit, in which the first to fourth printed wirings are provided without intersecting each other and without bypassing a second side of the printed wiring board divided by the first arrangement line.

5 Claims, 2 Drawing Sheets

(51) Int. Cl.
*H05K 1/18* (2006.01)
*H05K 1/02* (2006.01)
*H01L 23/00* (2006.01)
B60L 50/60 (2019.01)
B60L 58/10 (2019.01)
B60K 6/22 (2007.10)
H02M 3/04 (2006.01)
H02P 27/06 (2006.01)

(52) U.S. Cl.
CPC ......... *H05K 1/0262* (2013.01); *H05K 1/0293* (2013.01); *H05K 1/0298* (2013.01); *H05K 1/111* (2013.01); *H05K 1/181* (2013.01); *B60K 6/22* (2013.01); *B60L 50/60* (2019.02); *B60L 58/10* (2019.02); *B60L 2210/12* (2013.01); *B60L 2210/14* (2013.01); *B60Y 2200/91* (2013.01); *B60Y 2200/92* (2013.01); *B60Y 2400/61* (2013.01); *H02M 3/04* (2013.01); *H02P 27/06* (2013.01); *H05K 1/114* (2013.01); *H05K 2201/10151* (2013.01); *H05K 2201/10522* (2013.01); *H05K 2201/10545* (2013.01)

(58) Field of Classification Search
CPC ................. H05K 1/0293; H05K 1/181; H05K 2201/10522; H05K 2201/10545; H05K 1/0262; H05K 1/111; G01R 19/10; H02M 3/04; B60Y 2200/92; B60Y 2400/61; B60Y 2200/91; H01L 24/47; B60L 2210/12; B60L 2210/14; B60L 50/60; B60L 58/10; B60K 6/22; H02P 27/06; H02J 7/04; H02J 7/00
See application file for complete search history.

(56) References Cited

U.S. PATENT DOCUMENTS

| | | | |
|---|---|---|---|
| 9,024,572 B2* | 5/2015 | Nishihara | H01M 10/482 320/107 |
| 2017/0066343 A1* | 3/2017 | Kaita | B60L 58/10 |
| 2017/0222282 A1* | 8/2017 | Cubero Pitel | B60L 58/10 |

FOREIGN PATENT DOCUMENTS

| | | |
|---|---|---|
| JP | 2014228302 A | 12/2014 |
| JP | 2016136608 A | 7/2016 |
| JP | 2017167050 A | 9/2017 |
| WO | 2011024477 A1 | 3/2011 |

OTHER PUBLICATIONS

"TPS55332-Q1 2.2-MHz, 60-V Output Step Up DC-DC Converter," Texas Instruments; Jun. 1, 2009; Retrieved from the Internet: URL:http://www.ti.com/lit/ds/symlink/tps55332-q1.pdf [retrived on Sep. 26, 2019]; 36 pages.
Extended European Search Report corresponding to Application No. 19161899.0-1205/3565388; dated Oct. 9, 2019.

* cited by examiner

VOLTAGE DETERMINATION DEVICE

CROSS REFERENCE TO RELATED APPLICATION

The present application claims priority under 35 U.S.C. § 119 to Japanese Application No. 2018-066818, filed Mar. 30, 2018, the entire content of which is incorporated herein by reference.

BACKGROUND OF THE INVENTION

Field of the Invention

The present invention relates to a voltage determination device.

Description of Related Art

Patent Document 1 discloses a semiconductor device (voltage determination circuit) having a multichip structure provided with a first chip that divides a high voltage and a second chip that amplifies and outputs a potential difference input from the first chip. This voltage determination circuit is capable of determining a high voltage (about 1000 V) used in a motor drive device for a vehicle such as a hybrid vehicle or an electric vehicle.

[Patent Document 1] Japanese Unexamined Patent Application, First Publication No. 2016-136608

SUMMARY OF THE INVENTION

When a plurality of voltage determination circuits are mounted on a printed wiring board in the motor drive device, since a high voltage is applied to each of the voltage determination circuits, it is necessary to consider the disposition of the voltage determination circuits so as not to cause a short circuit due to insufficient insulation. That is, it is necessary to determine the layout of the voltage determination circuits and input wirings for inputting a determination target voltage to each of the voltage determination circuits so as to satisfy insulation performance. In addition, as the size of the printed wiring board increases, the size of the motor drive device increases. Therefore, when determining the layout of the voltage determination circuits and the input wirings, it is desirable not to increase a mounting area on the printed wiring board unnecessarily.

The present invention has been made in view of the above-described circumstances, and an object of the present invention is to secure predetermined insulation performance while limiting an increase in a mounting area on a printed wiring board when a plurality of voltage determination circuits are mounted on the printed wiring board.

A voltage determination device according to an aspect of the present invention a printed wiring board on which a first substrate terminal to which a first voltage is input from an outside, a second substrate terminal to which a second voltage is input from the outside, and a third substrate terminal to which a third voltage is input from the outside are arranged in substantially one line; a first voltage determination circuit mounted on a first surface of the printed wiring board and configured to determine a voltage difference between the first voltage and the second voltage, the first voltage determination circuit being disposed on a first side of the printed wiring board divided by a first arrangement line passing through the first to third substrate terminals; a second voltage determination circuit mounted on the first surface of the printed wiring board and configured to determine a voltage difference between the third voltage and the second voltage, the second voltage determination circuit being disposed on the first side of the printed wiring board divided by the first arrangement line; a first printed wiring connecting the first substrate terminal and the first voltage determination circuit to each other; a second printed wiring connecting the second substrate terminal and the first voltage determination circuit to each other; a third printed wiring connecting the third substrate terminal and the second voltage determination circuit to each other; and a fourth printed wiring connecting the second substrate terminal and the second voltage determination circuit to each other, in which the first to fourth printed wirings are provided without intersecting each other and without bypassing a second side of the printed wiring board divided by the first arrangement line.

In the voltage determination device according to the aspect of the present invention, the first voltage determination circuit may include a first high voltage side input terminal connected to the first substrate terminal through the first printed wiring and a first low voltage side input terminal connected to the second substrate terminal through the second printed wiring, the second voltage determination circuit may include a second high voltage side input terminal connected to the third substrate terminal through the third printed wiring and a second low voltage side input terminal connected to the second substrate terminal through the fourth printed wiring, and the first voltage determination circuit and the second voltage determination circuit may be disposed so that the first low voltage side input terminal and the second low voltage side input terminal are adjacent to each other.

In the voltage determination device according to the aspect of the present invention, the first high voltage side input terminal, the first low voltage side input terminal, the second low voltage side input terminal, and the second high voltage side input terminal may be arranged in substantially one line.

In the voltage determination device according to the aspect of the present invention, the first arrangement line and a second arrangement line passing through the first high voltage side input terminal, the first low voltage side input terminal, the second low voltage side input terminal, and the second high voltage side input terminal may be parallel to each other.

The voltage determination device according to the aspect of the present invention may further include a third voltage determination circuit mounted on a second surface facing the first surface of the printed wiring board and configured to determine a voltage difference between the second voltage and the third voltage, the third voltage determination circuit being disposed on the first side of the printed wiring board divided by the first arrangement line; a fifth printed wiring connecting the third substrate terminal and the third voltage determination circuit to each other; and a sixth printed wiring connecting the second substrate terminal and the third voltage determination circuit to each other.

According to the present invention, it is possible to limit an increase in a mounting area when the first and second voltage determination circuits are mounted on the printed wiring board, and it is possible to secure predetermined insulation performance.

DETAILED DESCRIPTION OF THE INVENTION

Hereinafter, an embodiment of the present invention will be described with reference to the drawings.

Figure 1:
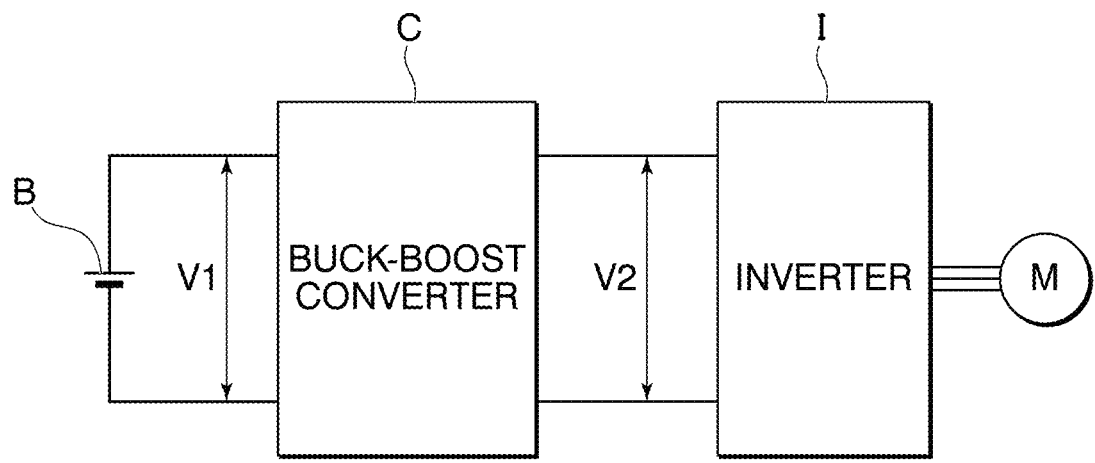
FIG. 1 is a block diagram showing a voltage determination target of a voltage determination device according to an embodiment of the present invention.

A voltage determination device A according to the present embodiment is provided in a hybrid vehicle, an electric vehicle, or the like, and determines a voltage in a power control unit (PCU) that controls a drive motor or the like. That is, as shown in FIG. 1, the PCU includes a buck-boost converter C that converts power of a battery B and an inverter I, and the voltage determination device A determines an input voltage V1 (battery voltage) of the battery B and an output voltage V2 of the buck-boost converter C in the PCU.

In the PCU, a reference potential wiring of the buck-boost converter C is commonly connected to a negative terminal of the battery B, and the buck-boost converter C is operated using a voltage (negative voltage) of the negative terminal of the battery B as a reference voltage. That is, the buck-boost converter C steps up the battery voltage (direct current voltage) or steps down a regenerative voltage (direct current voltage) input from the inverter I using the negative voltage of the battery B as the reference voltage.

Figure 2:
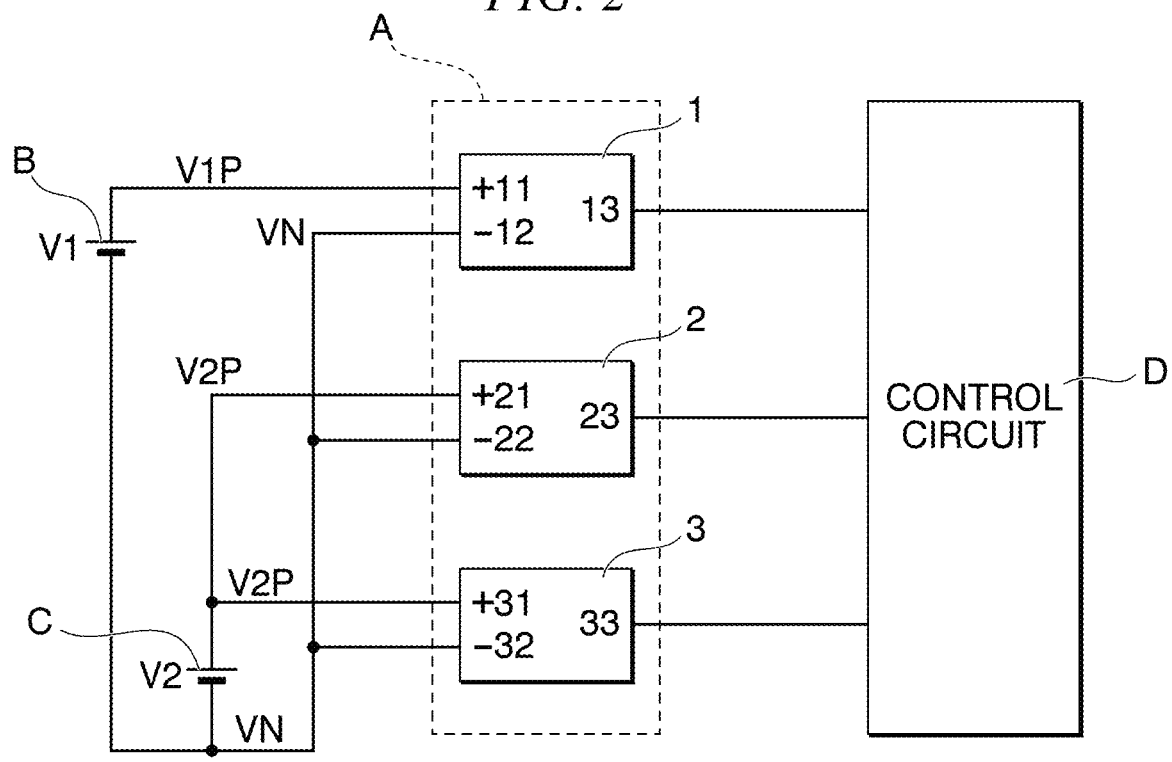
FIG. 2 is a circuit diagram of the voltage determination device according to the embodiment of the present invention.

As shown in FIG. 2, the voltage determination device A includes a first voltage determination circuit 1, a second voltage determination circuit 2, and a third voltage determination circuit 3, and outputs a determination result to a control circuit D. Note that, since both of the input voltage V1 and the output voltage V2 are direct current voltages and the negative terminal of the battery B is connected to the reference potential wiring of the buck-boost converter C, in FIG. 2, the input voltage V1 and the output voltage V2 are represented as two voltage sources (equivalent circuits) whose minus terminals are commonly connected.

The first voltage determination circuit 1 determines the input voltage V1. The first voltage determination circuit 1 is a differential amplifier including a plurality of resistors and an operational amplifier (active element). The first voltage determination circuit 1 includes an input terminal 11 (first high voltage side input terminal), an input terminal 12 (first low voltage side input terminal), and an output terminal 13.

The input terminal 11 is connected to a positive terminal of the battery B and an input terminal of the buck-boost converter C. A voltage (first voltage V1P) of the positive terminal of the battery B is input to the input terminal 11. The input terminal 12 is connected to the negative terminal of the battery B and the reference potential wiring of the buck-boost converter C. A voltage (second voltage VN) of the negative terminal of the battery B is input to the input terminal 12. The first voltage determination circuit 1 determines the voltage difference between the first voltage V1P and the second voltage VN. The voltage difference is a voltage obtained by dividing the input voltage V1.

The output terminal 13 is connected to the control circuit D. The output terminal 13 outputs a determination result of the first voltage determination circuit 1 to the control circuit D.

The second voltage determination circuit 2 determines the output voltage V2. The second voltage determination circuit 2 is a differential amplifier including a plurality of resistors and an operational amplifier (active element). The second voltage determination circuit 2 includes an input terminal 21 (second high voltage side input terminal), an input terminal 22 (second low voltage side input terminal), and an output terminal 23.

The input terminal 21 is connected to an output terminal of the buck-boost converter C. A voltage (third voltage V2P) of the output terminal of the buck-boost converter C is input to the input terminal 21. The input terminal 22 is connected to the reference potential wiring of the buck-boost converter C. The second voltage VN, which is the voltage of the reference potential wiring, that is, the voltage of the negative terminal of the battery B, is input to the input terminal 22. The second voltage determination circuit 2 determines the voltage difference between the second voltage VN and the third voltage V2P. The voltage difference is a voltage obtained by dividing the output voltage V2.

The output terminal 23 is connected to the control circuit D. The output terminal 23 outputs a determination result of the second voltage determination circuit 2 to the control circuit D.

The third voltage determination circuit 3 is provided for redundancy, and determines the output voltage V2 similarly to the second voltage determination circuit 2. The third voltage determination circuit 3 is a differential amplifier including a plurality of resistors and an operational amplifier (active element). The third voltage determination circuit 3 includes an input terminal 31 (third high voltage side input terminal), an input terminal 32 (third low voltage side input terminal), and an output terminal 33.

The input terminal 31 is connected to the output terminal of the buck-boost converter C. The voltage (third voltage V2P) of the output terminal of the buck-boost converter C is input to the input terminal 31. The input terminal 32 is connected to the reference potential wiring of the buck-boost converter C. The second voltage VN is input to the input terminal 32. The third voltage determination circuit 3 determines the voltage difference between the second voltage VN and the third voltage V2P. The output terminal 33 is connected to the control circuit D. The output terminal 33 outputs a determination result of the third voltage determination circuit 3 to the control circuit D.

The determination results of the first to third voltage determination circuits 1 to 3 are input to the control circuit D. The control circuit D is connected to a host control device such as a motor ECU (Electronic Control Unit) via a predetermined communication cable or the like, and controls the PCU, that is, the buck-boost converter C and the inverter I, on the basis of the determination results of the first to third voltage determination circuits 1 to 3.

Next, a mechanical constitution of the voltage determination device A will be described with reference to FIG. 3A and FIG. 3B.

The voltage determination device A includes the first voltage determination circuit 1, the second voltage determination circuit 2, the third voltage determination circuit 3, and a printed wiring board 4. The printed wiring board 4 has a substantially rectangular shape, and the voltage determining device A, the control circuit D (for example, a control circuit (not shown) of the inverter I and a control circuit (not shown) of the buck-boost converter C) and the like are mounted on the printed wiring board 4. FIG. 3A is a view of a main part of the voltage determination device A as seen from a side of a first surface 4a of the printed wiring board 4 and FIG. 3B is a view of the main part of the voltage determination device A as seen from a side of a second surface 4b of the printed wiring board 4.

The printed circuit board 4 is provided with a first substrate terminal 41, a second substrate terminal 42, and a third substrate terminal 43. The first to third substrate terminals 41 to 43 are arranged in substantially one line on a first arrangement line L1 which is an imaginary line. The first to third substrate terminals 41 to 43 are provided so as to penetrate the printed wiring board 4 from the first surface 4a to the second surface 4b. The first to third substrate terminals 41 to 43 are disposed in the vicinity of an end portion 4c on one side of the printed wiring board 4 and are arranged in substantially one line along the end portion 4c.

The first substrate terminal 41 is a positive power supply terminal connected to the positive terminal of the battery B and the input terminal of the buck-boost converter C. The second substrate terminal 42 is a negative power supply terminal connected to the negative terminal of the battery B and the reference potential wiring of the buck-boost converter C. The third substrate terminal 43 is a positive power supply terminal connected to the output terminal of the buck-boost converter C. The second substrate terminal 42 that is the negative power supply terminal is disposed between the first substrate terminal 41 and the third substrate terminal 43 that are the positive power supply terminals.

The voltage (first voltage V1P) of the positive terminal of the battery B is input to the first substrate terminal 41 from an outside. The voltage of the negative terminal of the battery B and the voltage (second voltage VN) of the negative power supply terminal connected to the reference potential wiring of the buck-boost converter C are input to the second substrate terminal 42 from the outside. The voltage (third voltage V2P) of the output terminal of the buck-boost converter C is input to the third substrate terminal 43 from the outside. The voltage (first voltage V1P) applied to the first substrate terminal 41 is lower than the voltage (third voltage V2P) applied to the third substrate terminal 43.

Figure 3A:
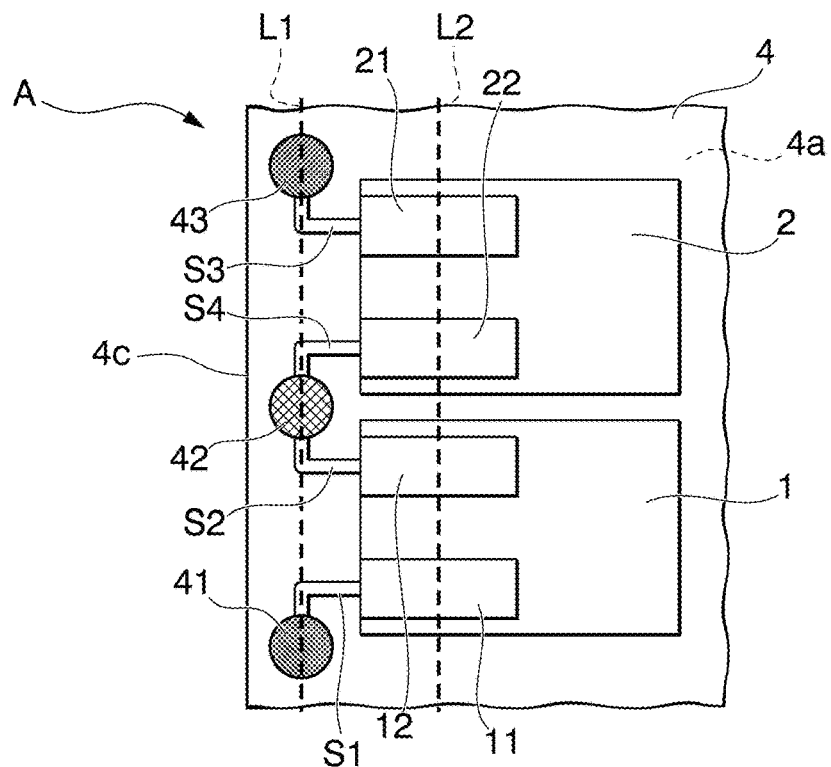
FIG. 3A is a view showing the voltage determination device according to the embodiment of the present invention, as seen from a first surface side of a printed wiring board.

As shown in FIG. 3A, the first voltage determination circuit 1 and the second voltage determination circuit 2 are mounted on the first surface 4a of the printed wiring board 4. The first voltage determination circuit 1 and the second voltage determination circuit 2 are disposed on a first side (one side) of the printed wiring board 4 divided by the first arrangement line L1.

The first voltage determination circuit 1 and the second voltage determination circuit 2 are disposed so that the input terminal 11, the input terminal 12, the input terminal 21, and the input terminal 22 are arranged in substantially one line on a second arrangement line L2 which is an imaginary line. Note that the first arrangement line L1 and the second arrangement line L2 are parallel to each other. In addition, the input terminal 12 and the input terminal 22 are disposed adjacent to each other in a direction along the second arrangement line L2.

The input terminals 11, 12, 21, and 22 are provided at an end of the first and second voltage determination circuits 1 and 2 on a side close to the first to third substrate terminals 41 to 43. The input terminal 11 is disposed at a position close to the first substrate terminal 41. The input terminal 12 and the input terminal 22 are disposed at positions close to the second substrate terminal 42. The input terminal 21 is disposed at a position close to the third substrate terminal 43.

A first printed wiring S1, a second printed wiring S2, a third printed wiring S3, and a fourth printed wiring S4 are formed on the first surface 4a of the printed wiring board 4. The first to fourth printed wirings S1 to S4 are formed on the printed wiring board 4 in advance.

The first printed wiring S1 connects the first substrate terminal 41 and the input terminal 11 to each other. Therefore, the input terminal 11 is connected to the positive terminal of the battery B and the input terminal of the buck-boost converter C through the first substrate terminal 41 and the first printed wiring S1.

The second printed wiring S2 connects the second substrate terminal 42 and the input terminal 12 to each other. Therefore, the input terminal 12 is connected to the negative terminal of the battery B and the reference potential wiring of the buck-boost converter C through the second substrate terminal 42 and the second printed wiring S2.

The third printed wiring S3 connects the third substrate terminal 43 and the input terminal 21 to each other. Therefore, the input terminal 21 is connected to the output terminal of the buck-boost converter C through the third substrate terminal 43 and the third printed wiring S3.

The fourth printed wiring S4 connects the second substrate terminal 42 and the input terminal 22 to each other. Therefore, the input terminal 22 is connected to the negative terminal of the battery B and the reference potential wiring of the buck-boost converter C through the second substrate terminal 42 and the fourth printed wiring S4.

In the present embodiment, the second substrate terminal 42 to which the input terminals 12 and 22 are connected is common. In addition, the first to fourth printed wirings S1 to S4 connecting the input terminals 11, 12, 21, and 22 and the first to third substrate terminals 41, 42 and 43, respectively, are provided without intersecting each other and without bypassing a second side (the other side) of the printed wiring board 4 divided by the first arrangement line L1.

Figure 3B:
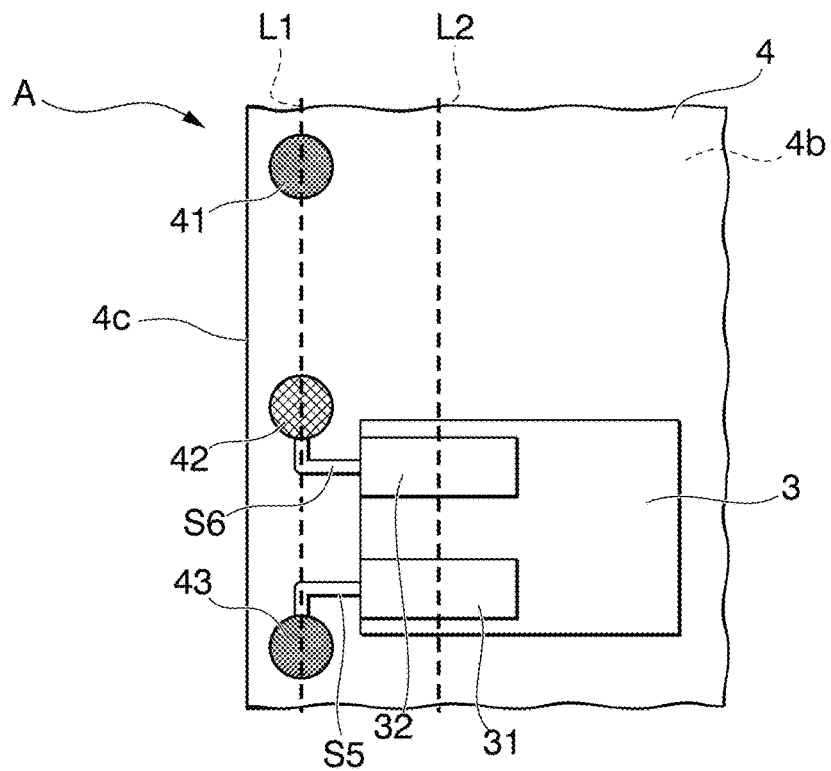
FIG. 3B is a view showing the voltage determination device according to the embodiment of the present invention, as seen from a second surface side of the printed wiring board.

As shown in FIG. 3B, the third voltage determination circuit 3 is mounted on the second surface 4b of the printed wiring board 4. The third voltage determination circuit 3 is disposed to face a backside of the second voltage determination circuit 2 with the printed wiring board 4 interposed therebetween. In addition, the third voltage determination circuit 3 is disposed so that the input terminal 31 faces the input terminal 21 with the printed wiring board 4 interposed therebetween and the input terminal 32 faces the input terminal 22 with the printed wiring board 4 interposed therebetween.

A fifth printed wiring S5 and a sixth printed wiring S6 are formed on the second surface 4b of the printed wiring board 4. The fifth and sixth printed wirings S5 and S6 are formed on the printed wiring board 4 in advance.

The fifth printed wiring S5 connects the third substrate terminal 43 and the input terminal 31 to each other. Therefore, the input terminal 31 is connected to the output terminal of the buck-boost converter C through the third substrate terminal 43 and the fifth printed wiring S5.

The sixth printed wiring S6 connects the second substrate terminal 42 and the input terminal 32 to each other. Therefore, the input terminal 32 is connected to the reference potential wiring of the buck-boost converter C through the second substrate terminal 42 and the sixth printed wiring S6.

As described above, in the present embodiment, the first and second voltage determination circuits 1 and 2 are mounted on the first surface 4a of the printed wiring board 4, the first and second voltage determination circuits 1 and 2 are disposed on the first side (one side) of the printed wiring board 4 divided by the first arrangement line L1, and the second substrate terminal 42 connected to the first and second voltage determination circuits 1 and 2 is common. Therefore, it is possible to dispose the first and second voltage determination circuits 1 and 2 side by side on the first side of the printed wiring board 4 divided by the first arrangement line L1, and it is possible to reduce the number of substrate terminals. Thus, it is possible to limit an increase in a mounting area when the first and second voltage determination circuits 1 and 2 are mounted on the printed wiring board 4. Furthermore, the first to fourth printed wirings S1 to S4 are provided without intersecting with each other and without bypassing the second side (the other side) of the printed wiring board 4 divided by the first arrangement line L1 passing through the first to third substrate terminals 41 to 43. Therefore, it is possible to mount the first and second voltage determination circuits 1 and 2 on the printed wiring board 4 in a state in which the insulation performance is secured. That is, according to the present embodiment, it is possible to limit the increase in the mounting area when the first and second voltage determination circuits 1 and 2 are mounted on the printed wiring board 4, and it is possible to secure a predetermined insulation performance.

In addition, the first voltage determination circuit 1 and the second voltage determination circuit 2 are disposed so that the input terminal 12 and the input terminal 22 are adjacent to each other. Therefore, it is possible to dispose the second substrate terminal 42 at a position close to both of the input terminals 12 and 22, and therefore it is possible to shorten a distance between the second substrate terminal 42 and the input terminals 12 and 22. Thus, it is possible to more effectively limit the increase in the mounting area when the first and second voltage determination circuits 1 and 2 are mounted on the printed wiring board 4.

In addition, the input terminals 11, 12, 21, and 22 are disposed in substantially one line. In addition, the first arrangement line L1 passing through the first to third substrate terminals 41 to 43 and the second arrangement line L2 passing through the input terminals 11, 12, 21, and 22 are parallel to each other. Therefore, it is possible to shorten the distance between the first to third substrate terminals 41 to 43 and the input terminals 11, 12, 21, and 22. Thus, it is possible to more effectively limit the increase in the mounting area when the first and second voltage determination circuits 1 and 2 are mounted on the printed wiring board 4.

In addition, the voltage determination device A further includes the third voltage determination circuit 3 that is mounted on the second surface 4b of the printed wiring board 4, is disposed on the first side of the printed wiring board 4 divided by the first arrangement line L1 passing through the first to third substrate terminals 41 to 43, and determines the voltage difference between the second voltage VN and the third voltage V2P. Therefore, since it is possible to mount the third voltage determination circuit 3 for redundancy of the second voltage determination circuit 2 on the printed wiring board 4 so as to face the second voltage determination circuit 2, by using the second surface of the printed wiring board 4, it is possible to limit the increase in the mounting area when the third voltage determination circuit 3 is mounted on the printed wiring board 4.

Note that the present invention is not limited to the above-described embodiment described with reference to the drawings, and various modifications are conceivable within the technical scope thereof.

For example, in the above-described embodiment, the constitution in which the input terminals 11, 12, 21, and 22 are arranged in substantially one line is adopted, but the present invention is not limited thereto. The input terminals 11, 12, 21, and 22 may not be arranged in substantially one line as long as the first to fourth printed wirings S1 to S4 are provided without intersecting each other and without bypassing the second side of the printed wiring board 4 divided by the first arrangement line L1 passing through the first to third substrate terminals 41 to 43.

In addition, the third voltage determination circuit 3 may be omitted.

In addition, a fourth voltage determination circuit for redundancy of the first voltage determination circuit 1 may be further provided. The fourth voltage determination circuit includes the same constitution as the first voltage determination circuit 1 and determines the input voltage V1 of the battery B. Specifically, the fourth voltage determination circuit includes a fourth high voltage side input terminal connected to the positive terminal of the battery B and the input terminal of the buck-boost converter C, a fourth low voltage side input terminal connected to the negative terminal of the battery B and the reference potential wiring of the buck-boost converter C, and an output terminal connected to the control circuit D. The voltage (first voltage V1P) of the positive terminal of the battery B is input to the fourth high voltage side input terminal and the voltage (second voltage VN) of the negative terminal of the battery B is input to the fourth low voltage side input terminal. The fourth voltage determination circuit determines the voltage difference between the first voltage V1P and the second voltage VN. The output terminal outputs a determination result of the fourth voltage determination circuit to the control circuit D.

The fourth voltage determination circuit is mounted on the second surface 4b of the printed wiring board 4. The fourth voltage determination circuit is disposed to face the backside of the first voltage determination circuit 1 with the printed wiring board 4 interposed therebetween. In addition, in the fourth voltage determination circuit, the fourth high voltage side input terminal is disposed to face the input terminal 11 with the printed wiring board 4 interposed therebetween, and the fourth low voltage side input terminal is disposed to face the input terminal 12 with the printed wiring board 4 interposed therebetween. That is, the input terminal 31, the input terminal 32, the fourth high voltage side input terminal, and the fourth low voltage side input terminal are arranged, on the second surface 4b, in substantially one line on the second arrangement line L2. The input terminal 32 and the fourth low voltage side input terminal are disposed so as to be adjacent to each other in a direction along the second arrangement line L2. A seventh printed wiring that connects the first substrate terminal 41 and the fourth high voltage side input terminal to each other, and an eighth printed wiring that connects the second substrate terminal 42 and the fourth low voltage side input terminal to each other are further formed on the second surface 4b of the printed wiring board 4.

In this case, the second substrate terminal 42 to which the input terminal 32 and the fourth low voltage side input terminal are connected is common. In addition, similarly to the first to fourth printed wirings S1 to S4, the fifth to eighth printed wirings can be provided without intersecting with each other and without bypassing the second side of the printed wiring board 4 divided by the first arrangement line L1.

Besides, within the scope not departing from the spirit of the present invention, it is possible to appropriately replace the components in the above embodiment with known components, and it is possible to appropriately combine the above-described modifications.

What is claimed is:

1. A voltage determination device comprising:
a printed wiring board on which a first substrate terminal to which a first voltage is input from an outside, a second substrate terminal to which a second voltage is input from the outside, and a third substrate terminal to which a third voltage is input from the outside are arranged in substantially one line;
a first voltage determination circuit mounted on a first surface of the printed wiring board and configured to determine a voltage difference between the first voltage and the second voltage, the first voltage determination circuit being disposed on a first side of the printed wiring board divided by a first arrangement line passing through the first to third substrate terminals;
a second voltage determination circuit mounted on the first surface of the printed wiring board and configured to determine a voltage difference between the third voltage and the second voltage, the second voltage determination circuit being disposed on the first side of the printed wiring board divided by the first arrangement line;
a first printed wiring connecting the first substrate terminal and the first voltage determination circuit to each other;
a second printed wiring connecting the second substrate terminal and the first voltage determination circuit to each other;
a third printed wiring connecting the third substrate terminal and the second voltage determination circuit to each other; and
a fourth printed wiring connecting the second substrate terminal and the second voltage determination circuit to each other,
wherein the first to fourth printed wirings are provided without intersecting each other and without bypassing a second side of the printed wiring board divided by the first arrangement line.

2. The voltage determination device according to claim 1, wherein the first voltage determination circuit includes a first high voltage side input terminal connected to the first substrate terminal through the first printed wiring and a first low voltage side input terminal connected to the second substrate terminal through the second printed wiring,
the second voltage determination circuit includes a second high voltage side input terminal connected to the third substrate terminal through the third printed wiring and a second low voltage side input terminal connected to the second substrate terminal through the fourth printed wiring, and
the first voltage determination circuit and the second voltage determination circuit are disposed so that the first low voltage side input terminal and the second low voltage side input terminal are adjacent to each other.

3. The voltage determination device according to claim 2, wherein the first high voltage side input terminal, the first low voltage side input terminal, the second low voltage side input terminal, and the second high voltage side input terminal are arranged in substantially one line.

4. The voltage determination device according to claim 3, wherein the first arrangement line and a second arrangement line passing through the first high voltage side input terminal, the first low voltage side input terminal, the second low voltage side input terminal, and the second high voltage side input terminal are parallel to each other.

5. The voltage determination device according to claim 1, further comprising:
a third voltage determination circuit mounted on a second surface facing the first surface of the printed wiring board and configured to determine a voltage difference between the second voltage and the third voltage, the third voltage determination circuit being disposed on the first side of the printed wiring board divided by the first arrangement line;
a fifth printed wiring connecting the third substrate terminal and the third voltage determination circuit to each other; and
a sixth printed wiring connecting the second substrate terminal and the third voltage determination circuit to each other.

* * * * *